United States Patent
Periyannan et al.

(10) Patent No.: US 11,456,272 B2
(45) Date of Patent: Sep. 27, 2022

(54) STRAIGHT WIREBONDING OF SILICON DIES

(71) Applicant: Western Digital Technologies, Inc., San Jose, CA (US)

(72) Inventors: Kirubakaran Periyannan, Santa Clara, CA (US); Daniel Linnen, Naperville, IL (US); Jayavel Pachamuthu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/171,576

(22) Filed: Feb. 9, 2021

(65) Prior Publication Data

US 2022/0084979 A1 Mar. 17, 2022

Related U.S. Application Data

(60) Provisional application No. 63/077,069, filed on Sep. 11, 2020.

(51) Int. Cl.
*H01L 23/00* (2006.01)
*H01L 25/065* (2006.01)

(52) U.S. Cl.
CPC .............. *H01L 24/48* (2013.01); *H01L 24/05* (2013.01); *H01L 24/32* (2013.01); *H01L 24/45* (2013.01); *H01L 24/49* (2013.01); *H01L 24/73* (2013.01); *H01L 24/85* (2013.01); *H01L 24/92* (2013.01); *H01L 25/0657* (2013.01); *H01L 2224/04042* (2013.01); *H01L 2224/0556* (2013.01); *H01L 2224/05573* (2013.01); *H01L 2224/32145* (2013.01); *H01L 2224/4501* (2013.01); *H01L 2224/45147* (2013.01);
(Continued)

(58) Field of Classification Search
CPC ............................................. H01L 2225/06551
See application file for complete search history.

(56) References Cited

U.S. PATENT DOCUMENTS 6,271,598 B1  8/2001  Vindasius et al.
2005/0142954 A1  6/2005  Farnworth et al.
(Continued)

FOREIGN PATENT DOCUMENTS

CN   111081695 A   4/2020
JP   S6118164 A    1/1986
(Continued)

*Primary Examiner* — Yu-Hsi D Sun
(74) *Attorney, Agent, or Firm* — Michael Best & Friedrich LLP

(57) ABSTRACT

A method including stacking a number of silicon dice such that one or more edges of the dice are in vertical alignment, where the one or more edges include a number of connection pads. The method also includes positioning a connecting wire on a substantially perpendicular axis to the one or more edges. The connecting wire includes a number of solder blocks formed thereon. The solder blocks are spaced at intervals associated with a distance between a first set of aligned connection pads on the dice. The connecting wire is
(Continued)

positioned such that the solder blocks are in contact with the first set of aligned connection pads. The method also includes applying heat to cause the solder blocks to reflow and physically and electrically couple the connecting wire to the connection pads.

20 Claims, 11 Drawing Sheets

(52) U.S. Cl.
CPC .............. *H01L 2224/45611* (2013.01); *H01L 2224/4899* (2013.01); *H01L 2224/48108* (2013.01); *H01L 2224/48145* (2013.01); *H01L 2224/48147* (2013.01); *H01L 2224/48221* (2013.01); *H01L 2224/48496* (2013.01); *H01L 2224/48499* (2013.01); *H01L 2224/49175* (2013.01); *H01L 2224/73265* (2013.01); *H01L 2224/85007* (2013.01); *H01L 2224/85815* (2013.01); *H01L 2224/92247* (2013.01); *H01L 2225/0651* (2013.01); *H01L 2225/06506* (2013.01); *H01L 2225/06551* (2013.01); *H01L 2924/0105* (2013.01); *H01L 2924/01029* (2013.01); *H01L 2924/01046* (2013.01); *H01L 2924/01047* (2013.01); *H01L 2924/01049* (2013.01); *H01L 2924/01077* (2013.01); *H01L 2924/01079* (2013.01); *H01L 2924/01082* (2013.01); *H01L 2924/10253* (2013.01); *H01L 2924/14511* (2013.01)

(56) References Cited

U.S. PATENT DOCUMENTS

| | | | |
|---|---|---|---|
| 2007/0290314 A1 | 12/2007 | Partridge et al. | |
| 2009/0085224 A1* | 4/2009 | Choi | H01L 25/0657 |
| | | | 438/109 |
| 2010/0148340 A1* | 6/2010 | Takano | H01L 21/561 |
| | | | 257/E23.116 |
| 2011/0272825 A1 | 11/2011 | McGrath et al. | |
| 2012/0187577 A1 | 7/2012 | Cordes et al. | |
| 2015/0035142 A1* | 2/2015 | Kim | H01L 23/49822 |
| | | | 257/737 |
| 2018/0114773 A1* | 4/2018 | Chiu | H01L 25/18 |

FOREIGN PATENT DOCUMENTS

| | | |
|---|---|---|
| JP | H1084012 A | 3/1998 |
| JP | 2001156250 A | 6/2001 |
| JP | 2013531882 A | 8/2013 |
| TW | 200605298 A | 2/2006 |
| TW | 200926387 A | 6/2009 |

* cited by examiner

STRAIGHT WIREBONDING OF SILICON DIES

CROSS-REFERENCE TO RELATED APPLICATION

This application claims priority to and the benefit of U.S. Provisional Patent Application No. 63/077,069, filed on Sep. 11, 2020, the entire contents of which is incorporated herein by reference.

BACKGROUND

This application relates generally to providing electrical connection between silicon dice, and more specifically to electrically connecting silicon dice along a vertical edge.

In certain silicon die architectures, connection pads are placed on the top or bottom of the dice. This takes up valuable space for forming transistors, and the required connection between dice, when they are stacked, requires the dice to be staggered in a stair step formation, resulting in more space being required to form the completed or packaged integrated device.

SUMMARY

The processes, devices, and system described herein describe electrically connecting silicon dice along a vertical edge of the dice, reducing required lateral space requirements. Specifically, by placing the connection pads on the vertical edges of the dice, the dice can be stacked vertically without the need for staggering the dice to allow for connections to be made via top or bottom located connection pads. Instead, linear connections may be made along vertically aligned, edge mounted connection pads, thereby allowing the silicon dice to be stacked in a purely vertical arrangement. This reduces the lateral footprint of the silicon dice, thereby allowing for a smaller overall form factor. Further, transistor formation is generally done on the top and/or bottom of a silicon die, and not on the vertical edges. By placing the connection pads on the edges, previously unused space on the silicon die is used for interconnections, freeing up space for transistor formation on the top and/or bottom of the silicon dice.

The methods and systems described herein provide a novel and advantageous connection technology for interconnection of silicon dice with edge formed connection pads, and particularly for silicon dice stacked vertically.

The disclosure also provides an apparatus including a substrate and two or more silicon dice where a first die is disposed on the substrate and a second die is disposed or stacked on the first die. The silicon dice include an upper planar surface parallel to the substrate, a lower planar surface parallel to the upper planar surface and spaced at a first distance from the first planar surface, a first edge portion disposed between and perpendicular to, the upper planar surface and the lower planar surface, and a first set of connection pads disposed on the first edge portion and in vertical alignment. The apparatus further includes a conductive element configured to be coupled to the one or more connection pads, and a number of solder blocks. The solder blocks are coupled to the conductive element and spaced at an interval associated with a distance between the first set of connection pads. In some embodiments, the solder blocks include a first groove having a width measuring approximately the same as a width of the first edge portion and configured to accept the edge of the silicon dice within the first groove.

The disclosure provides a method including stacking a number of silicon dice such that one or more edges of the silicon dice are in vertical alignment, wherein one or more edges include a number of connection pads. The method also includes positioning a substantially linear conductor on a substantially perpendicular axis to the one or more edges, wherein the linear conductor is in contact with one or more of the connection pads. The method further includes applying a conductive solder to the one or more connection pads and one or more portions of the linear conductor in contract with the one or more connection pads. The method also includes applying heat to reflow the solder to cause the solder to physically and electrically couple the one or more portions of the linear conductor to the one or more connection pads in contact therewith.

The disclosure also provides a method including stacking a number of silicon dice such that one or more edges of the number of silicon dice are in vertical alignment, wherein the one or more edges include a number of connection pads. The method also includes positioning a connecting wire on a substantially perpendicular axis to the one or more edges. The connecting wire includes a number of solder blocks. The solder blocks are spaced at an interval associated with a distance between a first set of aligned connection pads on the silicon dice. The connecting wire is positioned such that the solder blocks are in contact with the first set of aligned connection pads. The method also includes applying heat to reflow the solder blocks to cause the solder blocks to physically couple the connecting wire to the aligned connection pads.

In this manner, various aspects of the disclosure provide for improvements in at least the technical fields of silicon die interconnections and their design and architecture. While the disclosure is particularly useful for connecting stacked dice, those of skill in the art will understand that the disclosure may be used in other embodiments, for example, where a die is disposed orthogonal to a substrate. The foregoing summary is intended solely to give a general idea of various aspects of the disclosure, and does not limit the scope of the disclosure in any way.

DETAILED DESCRIPTION

In the following description, numerous details are set forth, such as silicon-based die configurations, silicon die electrical interconnection methods, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the disclosure, and does not limit the scope of the disclosure in any way.

Figure 1:
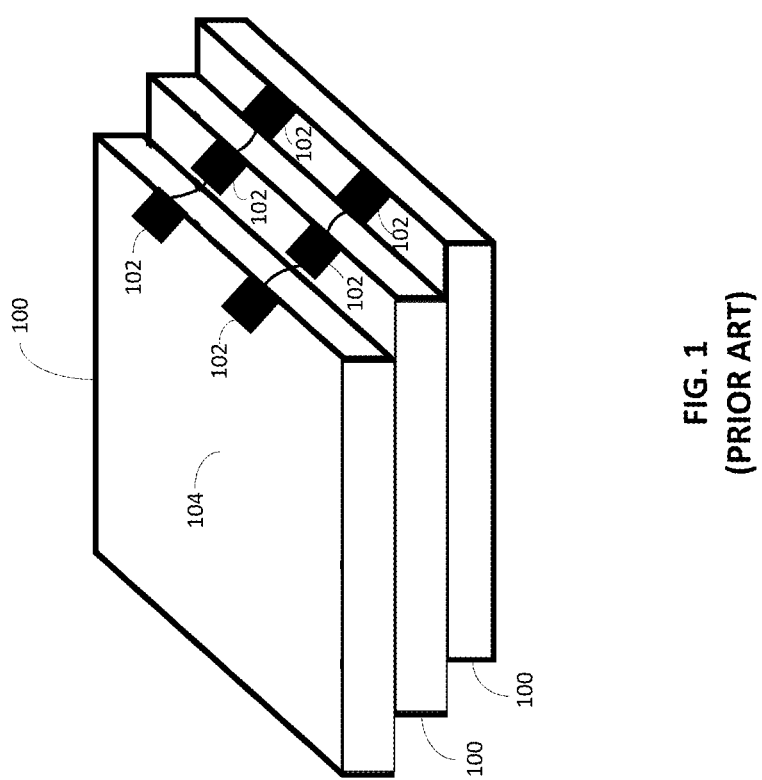
FIG. 1 is a perspective view of a known method of connecting one or more silicon dice, in accordance with some embodiments of the disclosure.

FIG. 1 is perspective view of a conventional method of connecting one or more silicon dice 100 within a packaged integrated circuit ("packaged IC") or other packaged silicon device ("package"), such as memory device. As shown in FIG. 1, the silicon dice 100 include one or more connection pads 102 positioned on a top surface 104 of the silicon dice 100. In order to connect the connection pads 102 of the silicon dice 100, the silicon dice 100 are staggered such that the connection pads 102 of each subsequent silicon die are exposed or accessible. This staggering of the silicon dice requires additional space within the package, thereby often causing the size of the package to increase. Further, as more dice are stacked, the upper dies will overhang more such that they are off-center, which can cause the dies to tilt and/or subject the dice to stress that can cause die cracking.

Figure 2B:
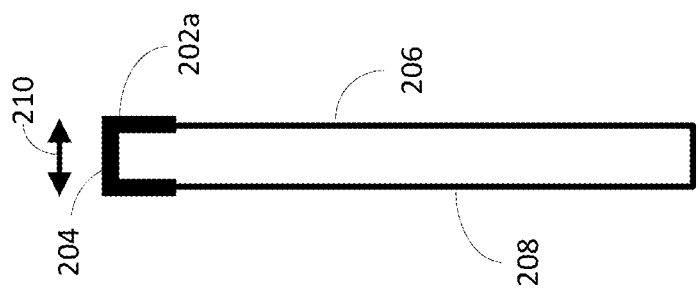
FIG. 2b is a cross-sectional side view of the silicon die of FIG. 2a, according to some embodiments of the disclosure.
Figure 2A:
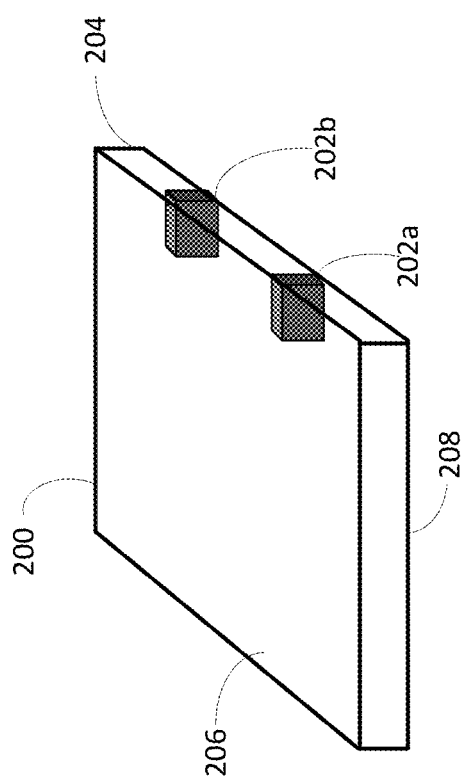
FIG. 2a is a perspective view of a silicon die having one or more vertical edge connection pads, according to some embodiments of the disclosure.

Turning now to FIG. 2a, a perspective view of a silicon die 200 having one or more connection pads 202a, 202b positioned on a vertical edge 204 is shown, according to some embodiments. The die 200 has a generally planar upper surface 206 and a generally planar lower surface 208 parallel to the upper surface 206 and spaced at a first distance from the upper surface 206. In the embodiment shown, the first distance is the width of the die 200. The vertical edge 204 is disposed between, and perpendicular to, the upper and lower planar surfaces 206 and 208. By positioning the connection pads 202a, 202b on the vertical edge, one or more silicon dice 200 may be stacked vertically, without having to stagger or offset the silicon dice 200, such as shown in FIG. 1. This allows for less space to be required when multiple silicon dice 200 are stacked within an integrated circuit.

FIG. 2b. is a cross-sectional side view of the silicon die 200, showing the connection pad 202a. As shown in FIG. 2b, the connection pad 202a may overlap partially the upper surface 206 and the lower surface 208. However, in some embodiments, there may be no external overlap of the connection pad 202a onto the upper surface 206 and/or lower surface 208. For example, the connection pad 202a (and connection pad 202b) may only be exposed on the vertical edge 204, with the remainder of the connection pad 202a located within the silicon die 200. In some embodiments, the connection pad may have a first length 210 of 25 microns. However, lengths of more than 25 microns or less than 25 microns are also contemplated. In some embodiments, the length may be equal to the width of the vertical edge 204 of the silicon die 200.

Figure 3:
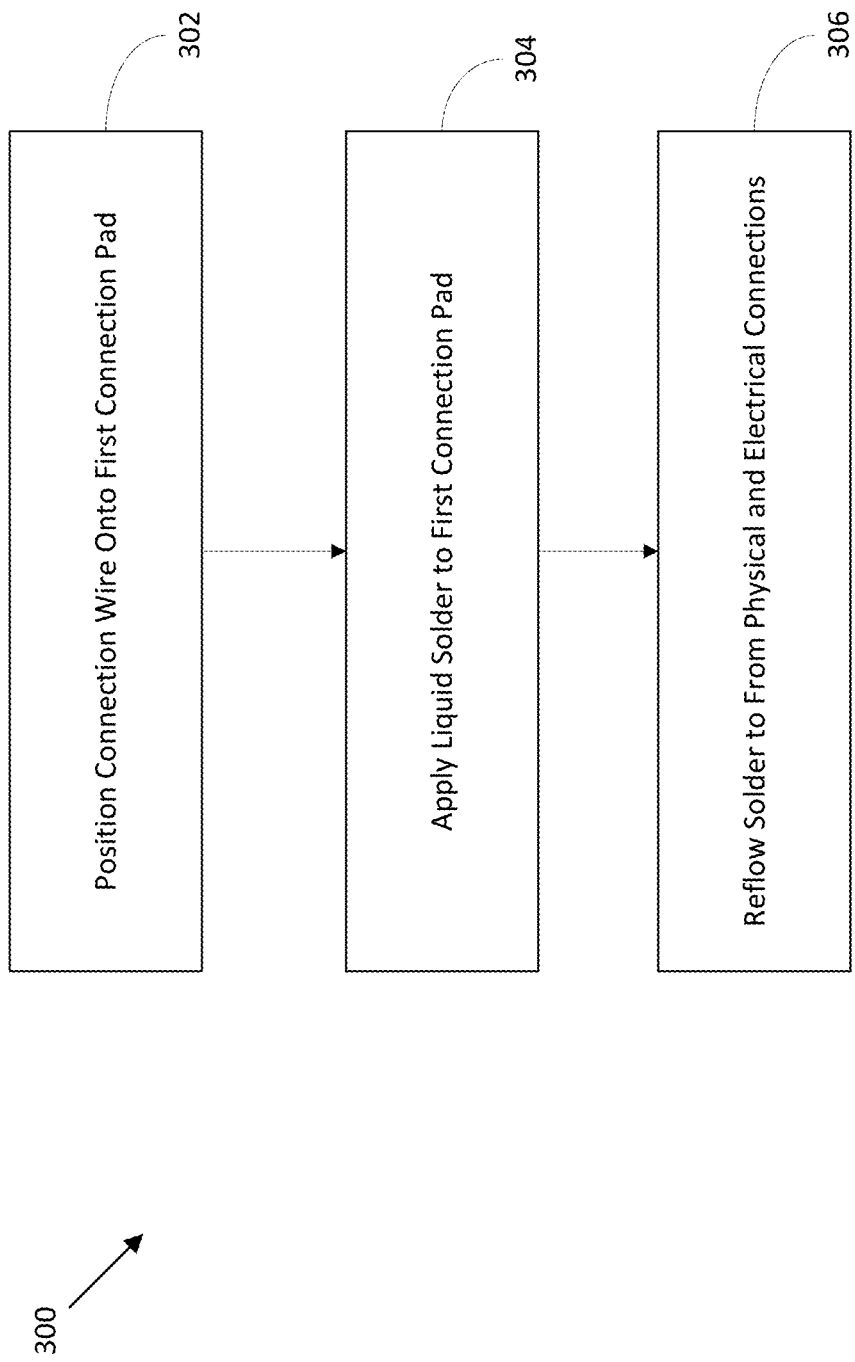
FIG. 3 is a flow chart illustrating a process for connecting two or more silicon dice, in accordance with some embodiments of the disclosure.

Turning now to FIG. 3, a process 300 for connecting two or more silicon dice is shown, according to some embodiments. At process block 302, a conductive connecting wire is positioned onto a first connection pad of a first silicon die. The connecting wire may be constructed of one or more metallic or other conductive materials, such as copper, aluminum, gold, palladium, indium, iridium, various silver/tin amalgams, lead, as well as binary and/or ternary metal alloys, etc. In one embodiment, the connecting wire comprises a copper core plated with a metal such as tin that protects the copper for oxidizing. In one embodiment, the connecting wire is a round or substantially round wire. However, in other examples, the connecting wire may be a flat or ribbon-type wire. In some embodiments, the connecting wires may have a diameter of approximately 24 µm. In other embodiments, the connecting wires may have a diameter in a range from about 16 µm to about 50 µm. In still further embodiments, the connecting wires may have a diameter of less than 16 µm or greater than 50 µm.

Figure 4B:
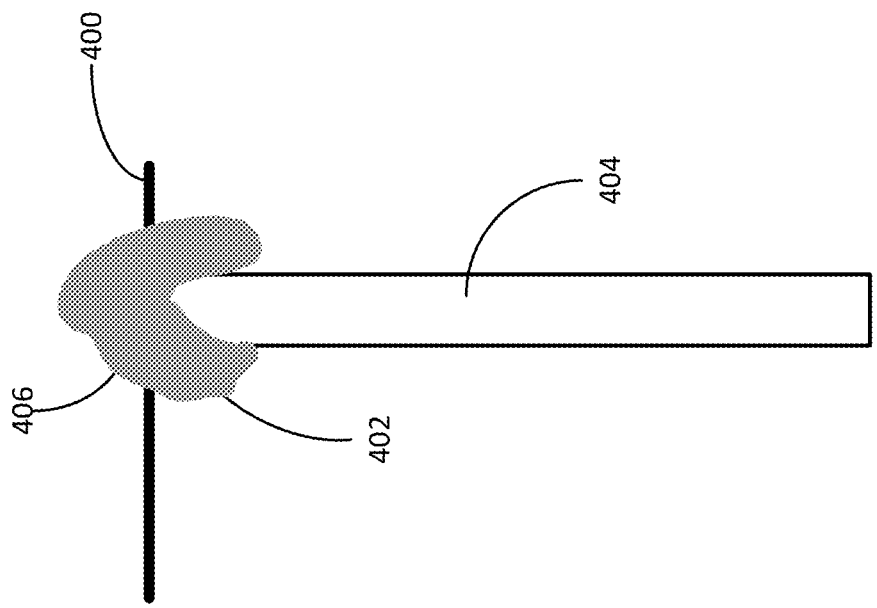
FIG. 4b is cross-section of a silicon die illustrating a further portion of the process described in FIG. 3, in accordance with some embodiments of the disclosure.
Figure 4A:
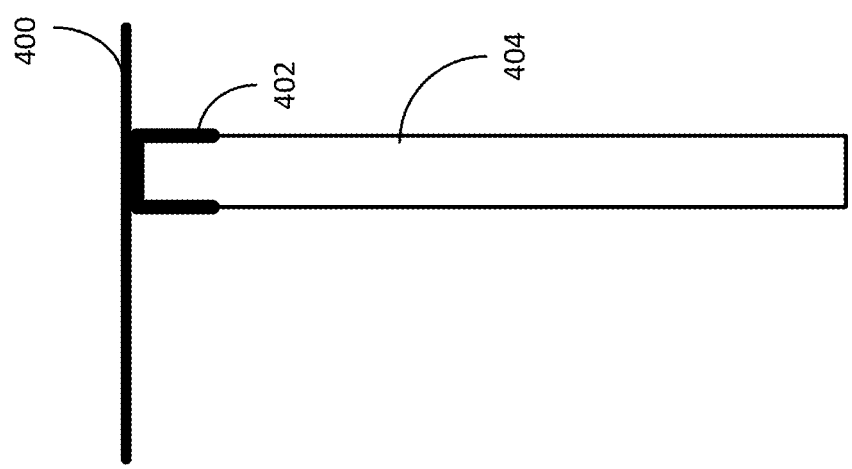
FIG. 4a is cross-section of a silicon die illustration of portion of the process described in FIG. 3, in accordance with some embodiments of the disclosure.

In some embodiments, the silicon die is positioned such that the connecting wire is able to lay across a connection pad and use gravity to maintain its position. This can be seen in FIG. 4a, which shows a conductive connecting wire 400 positioned onto a connection pad 402 of a silicon die 404. However, in other embodiments various other methods may be used to hold the connecting wire in place on a connection pad.

Once the connecting wire 400 is positioned on the first connection pad 402 of the first silicon die, a liquid solder is applied to the first connection pad 402 and the connecting wire 400 at process block 304. This can be seen in FIG. 4b, which shows a mass of liquid solder 406 applied to the first connection pad 402, that in turn encompasses the connecting wire 400. In some embodiments, the solder is a gold solder. In other embodiments, the solder may be a silver solder, a palladium solder, an iridium solder, an indium solder, silver/tin amalgams solder, one or more binary or ternary metal alloy solders, lead solder, or other applicable solder types. Generally, the solder is heated to reflow the solder into a liquid state for dispensing onto the connection pad 402.

Once the solder is applied, heat is applied to the solder, the connecting wire 400, and/or the first connection pad at process block 306. The heat melts or reflows the solder, causing the solder to create a solder joint between the first connection pad and the connecting wire. In some embodiments, the first connection pad and/or the connecting wire may be coated in a flux material to facilitate a proper solder joint being formed between the first connection pad and the connecting wire. While the above process 300 is described with regards to using solder to connect the connecting wire 400 to the first connection pad 402, it is contemplated that other connection processes may be used, such as welding, brazing, laser welding, and the like.

Figure 5:
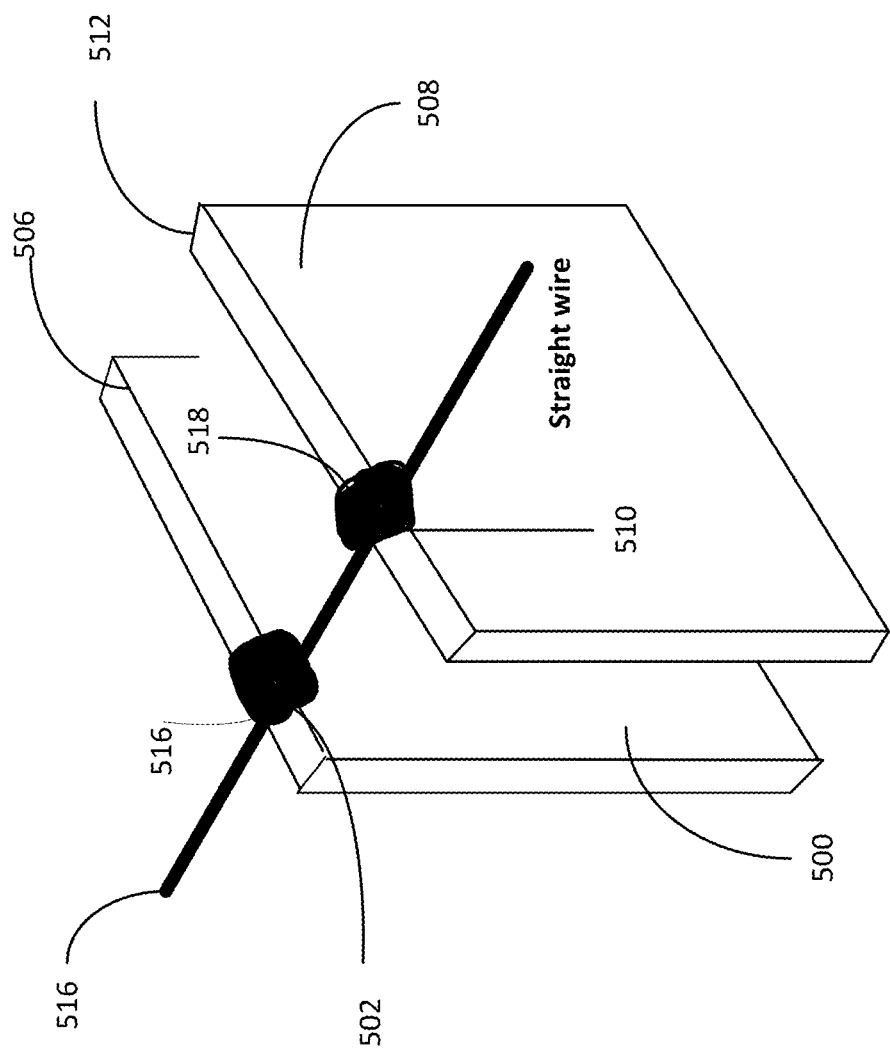
FIG. 5 is a perspective view of two silicon dice electrically coupled using the process described in FIG. 3, in accordance with some embodiments of the disclosure.

The process 300 may be used across multiple silicon dice. For example, as shown in FIG. 5, a first silicon die 500 having a first connection pad 502 on a first edge 506 is aligned with a second silicon die 508 having a second connection pad 510 on a first edge 512 of the second silicon die 508. It is contemplated that the first silicon die 500 and the second silicon die 508 are identical in size, and have their associated connection pads 502, 510 in identical positions to facilitate stacking of the silicon dice 500, 508. As described above in regards to process 300, a connecting wire 514 is positioned across both the first connection pad 502 and the second connection pad 510. Similar to above, the silicon dice 500, 508 may be positioned such that the first connection pad 502 and the second connection pad 510 are facing upwards to allow for gravity to apply a downward force on the connecting wire 514, thereby aiding in holding the connecting wire in place. Liquid solder may then be placed in a first mass (or "blob") 516 on the first connection pad 502, and then in a second mass 518 on the second connection pad 510. Heat is then applied to reflow the solder to facilitate a solder joint between the connecting wire 514 and the first connection pad 502 and the second connection pad 510.

In some embodiments, heat may be applied in a focused manner to the connection pads (and the associated solder masses and connecting wires), such as via a flame jet or laser heating. However, in other embodiments a general heat is applied to the silicon dice (such as silicon dice 500, 508) to facilitate melting or reflowing the solder at the connection pads of the dice. For example, the silicon dice may be placed in a reflow oven or be subject to a generalized heat source such as via a diffusion furnace.

Figure 6:
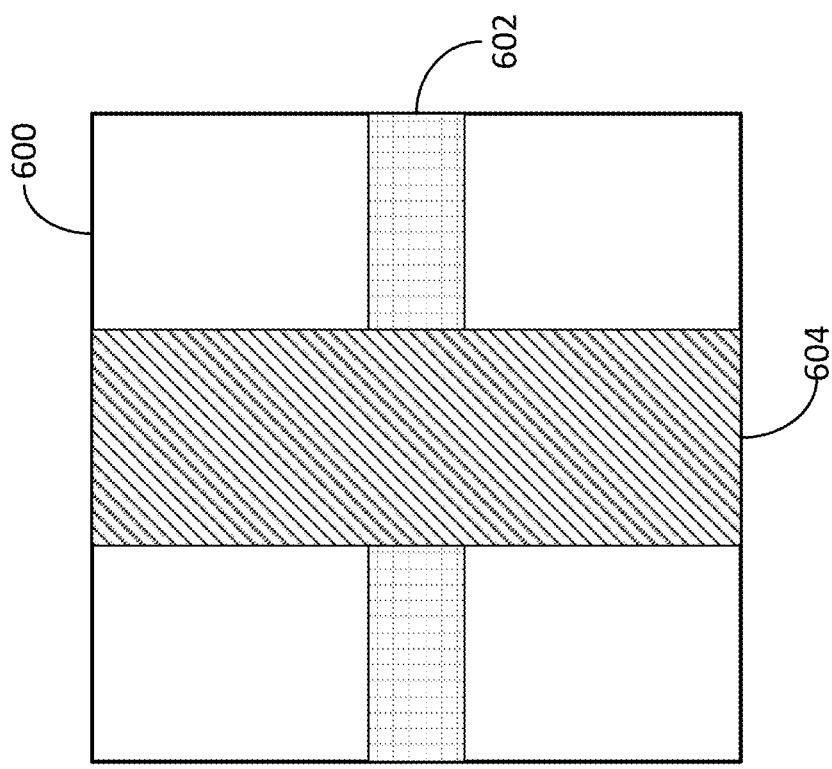
FIG. 6 is a bottom view of a solder block, in accordance with some embodiments of the disclosure.

Turning now to FIG. 6, a bottom-view of a solder block 600 is shown, according to some embodiments. The solder block 600 may be made of various solder materials, such as indium, gold, silver, palladium, iridium, lead, or other applicable solder types. As shown in FIG. 6, the solder block 600 may have a square shape, but other shapes are also contemplated. The solder block 600 may include a first trough or groove 602 and a second trough or groove 604. The first trough 602 may be sized to accommodate a connecting wire, such as those described above. In one embodiment, the first trough is approximately 15 microns in width. However, widths of less than 15 microns or more than 15 microns are also contemplated. The first trough 602 is positioned deeper within the solder block 600 than the second trough 604 to allow for the second trough 604 to receive all or part of a connection pad, such as those described above.

As stated above, the second trough 604 is configured to receive all or a portion of a connection pad of a silicon die, as discussed above. In one embodiment, the width of the second trough 604 is 25 microns. However, widths of more than 25 microns and less than 25 microns are contemplated. Further it is understood that the size of the second trough 604 may be sized to accommodate differently sized connection pads, as needed. For example, the second trough 604 may be approximately 10% wider than the width of a connection pad of the silicon die. However, the second trough may be more than 10% wider or less than 10%, as applicable. The depth of the second trough 604 may be sized to accept a depth of the connection pad to allow for an effective solder joint to form when the solder block 600 is heated (described in more detail below). For example, the depth of the second trough may be 5 microns. However, depths of more than 5 microns and less than 5 microns are also contemplated.

In some embodiments, the solder block 600 may be coupled to a connecting wire during manufacturing of the connecting wire. For example, multiple solder blocks 600 may be coupled to the connecting wire and spaced at a distance associated with a spacing between silicon dice. This can allow for a connecting wire to be placed into contact with multiple silicon dice such that the solder blocks 600 are positioned over the connection pads of the respective silicon dice.

Figure 7:
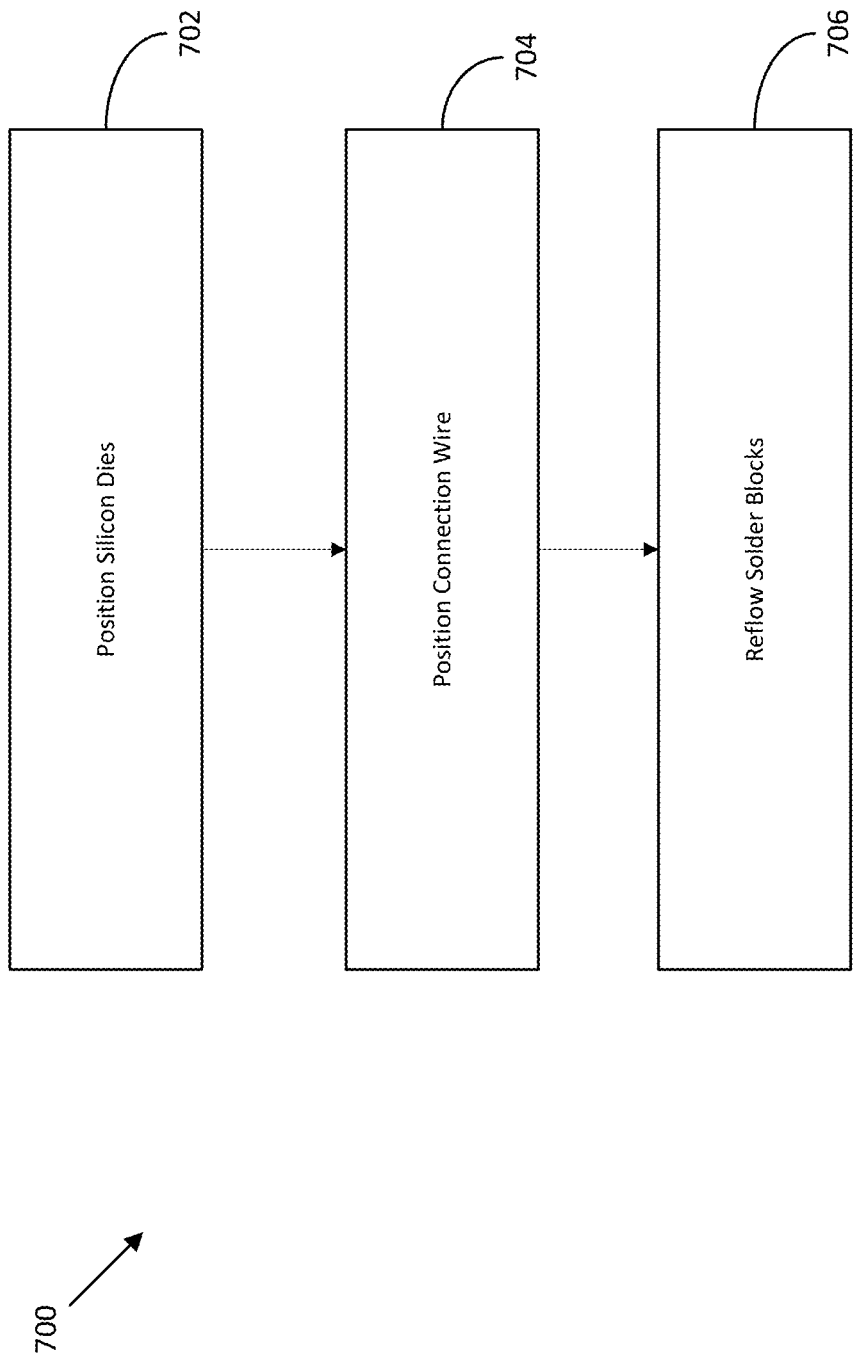
FIG. 7 is a flow chart illustrating a process for connecting multiple silicon dice to form a packaged IC or other packaged silicon device, in accordance with some embodiments of the disclosure.

Turning now to FIG. 7, a process 700 for connecting multiple silicon dice to form an integrated circuit is shown, according to some embodiments. At process block 702, two or more silicon dice are positioned together. As described above, the silicon dice may be stacked vertically such that the edges of the dice align with a common axis. In some examples, a die-attach-film, or die attach film adhesive may be placed between the silicon dice to secure them in position relative to each other. In other embodiments, a paste or other liquid adhesive may be placed between the silicon dice to secure them into position relative to each other. In some embodiments, the die attach film may provide a spacing distance between the silicon dice equal to the thickness of the die attach file. For example, the die attach film may have a thickness of 10 microns. However, thicknesses of more than 10 microns or less than 10 microns are also contemplated. In still further embodiments, the die attach film may be sized to not reach the edges of the dice, to allow for a slight gap at the edges of the die. In yet other embodiments, a spacer such as a blank silicon die may be used to space adjacent dice.

The silicon dice may also be positioned such that the connection pads are facing upward. For example, a work chuck holding the dice may be rotated to allow for the connection pads to be rotated to face upwards to allow for gravity to assist in holding a connecting wire in place, as described further herein. In some embodiments, the work chuck may be configured to rotate the silicon dice in multiple positions to allow for different connection pads to face upwards during a wire bonding/soldering process. It is further contemplated that the silicon dice are positioned using known die positioning techniques.

Figure 8:
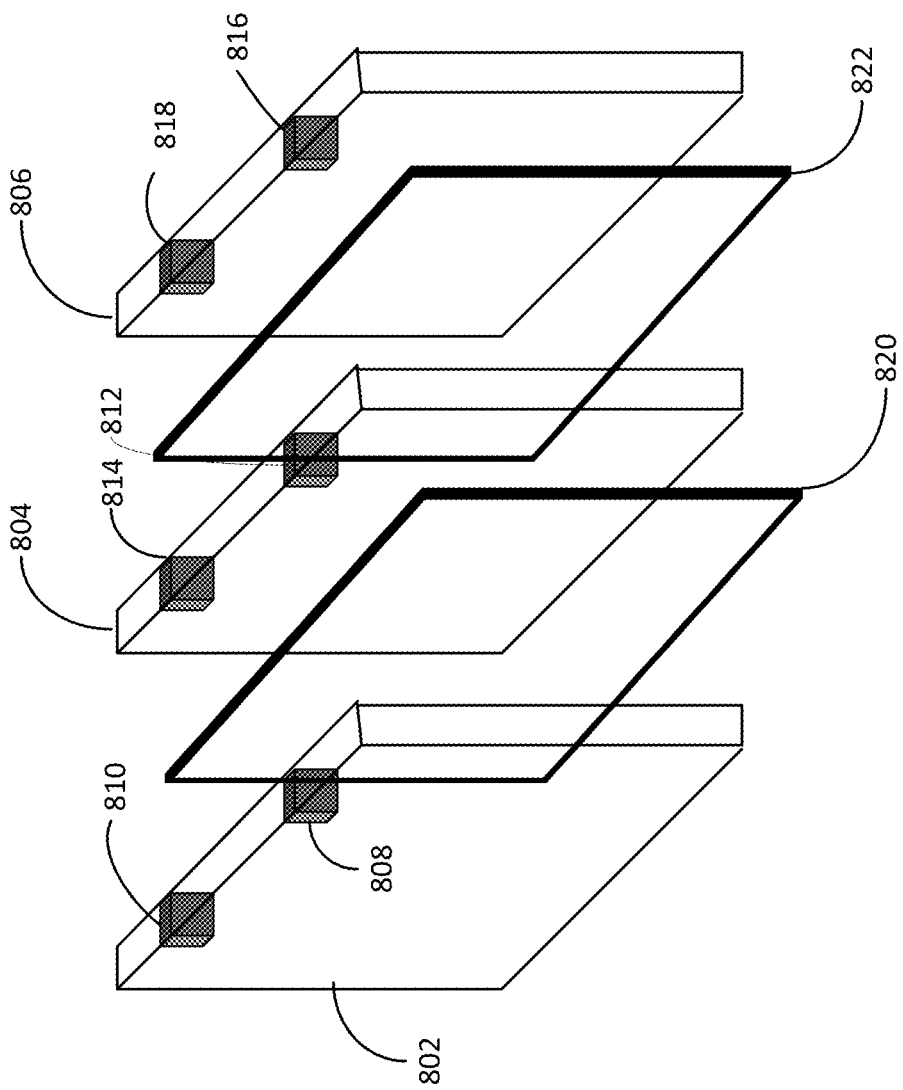
FIG. 8 is a perspective view of a plurality of silicon dice prepared to be electrically coupled, in accordance with some embodiments of the disclosure.

The positioning of the silicon dice is shown in FIG. 8. As shown in FIG. 8, an apparatus includes a first silicon die 802, a second silicon die 804, and a third silicon die 806, according to some embodiments. Each of the silicon dice 802, 804, 806 includes two connection pads 808, 810, 812, 814, 816, 818. The first silicon die 802 and the second silicon die 804 are separated by a first die attach film 820, and the second silicon die 804 and the third silicon die 806 are separated by a second die attach film 822. As shown in FIG. 8, the connection pads 808, 812, 816 are in a first alignment and form a first set, and connection pads 810, 814, and 818 are in a second alignment and form a second set.

Figure 9:
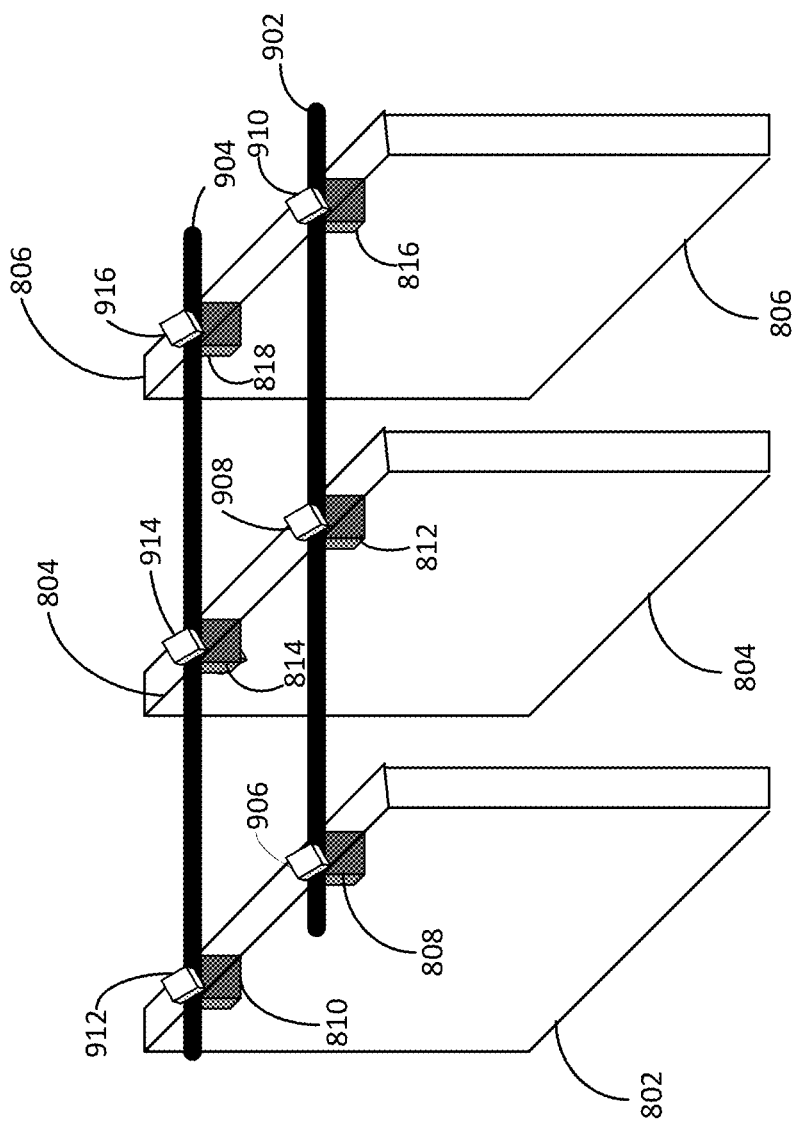
FIG. 9 is a perspective view of a plurality of silicon dice electrically coupled, in accordance with some embodiments of the disclosure.

Once the silicon dice have been positioned at process block 702, a connecting wire having two or more integrated solder blocks is positioned onto the two or more silicon dice at process block 704. In one embodiment, the connecting wire is positioned such that the integrated solder blocks are aligned with a set of vertically aligned connection pads (i.e., the first set or the second set). For example, as shown in FIG. 9, a first connecting wire 902 is positioned over the connection pads 808, 812, and 816 of the first silicon die 802, the second silicon die 804, and the third silicon die 806, respectively. The first connecting wire 902 has a first solder block 906, a second solder block 908, and a third solder block 910 that are spaced to align with the connection pads 808, 812, and 814, as shown. Similarly, a second connecting wire 904 is positioned over the connection pads 810, 814, and 818 of the first silicon die 802, the second silicon die 804, and the third silicon die 806, respectively. The first connecting wire 902 has a first solder block 912, a second solder block 914, and a third solder block 916 that are spaced to align with the connection pads 808, 812, and 814, as shown.

Retuning now to FIG. 7, once the connecting wires are positioned in process block 704, heat is applied to reflow the solder blocks at process block 706. In one embodiment, heat is applied to the solder blocks, the connection pads, and the connecting wires, as described above. In some embodiments, heat may be applied in a focused manner to the solder blocks (and the associated connection pads and connecting wires), such as via a flame jet or laser heating. However, in other embodiments a general heat is applied to the silicon dice to facilitate melting or reflowing the solder at the connection pads of the dice. For example, the silicon dice may be placed in a reflow oven or be subject to a generalized heat source such as via a diffusion furnace.

Figure 10:
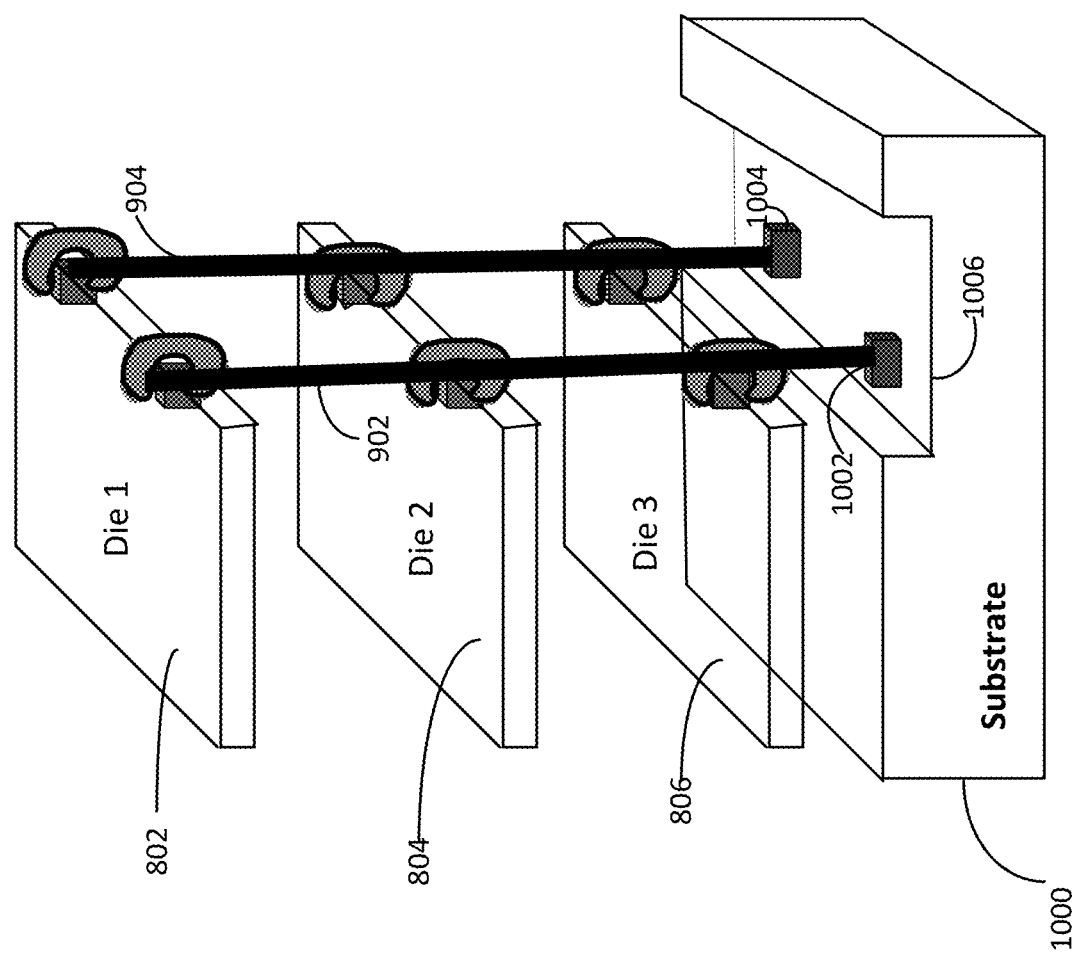
FIG. 10 is a perspective view of multiple silicon dice coupled to a substrate, in accordance with some embodiments of the disclosure.

Turning now to FIG. 10, the silicon dice 802, 804, and 806, described above, are coupled via connecting wires 902, 904 to a substrate 1000. The substrate 1000 may include a first connection pad 1002 and a second connection pad 1004 that are used to connect to the first connecting wire 902 and the second connecting wire 904, respectfully. In some embodiments, the substrate 1000 may include a channel 1006. In some embodiments, the channel 1006 allows for the connecting wires 902, 904 to be mounted to the substrate 1000 without requiring any bending or other deformation of the connecting wires. While the example of FIGS. 8, 9, and 10 illustrate examples of three silicon dice connected via two connecting wires, it is contemplated that the process 700 described above can be expanded for use with more than three silicon dice, and with more than two connecting wires, as needed. Accordingly, the examples of FIGS. 8, 9, and 10 are for illustrative purposes only and should not be construed as limiting the herein described processes to the specific components shown in the figures.

Figure 11:
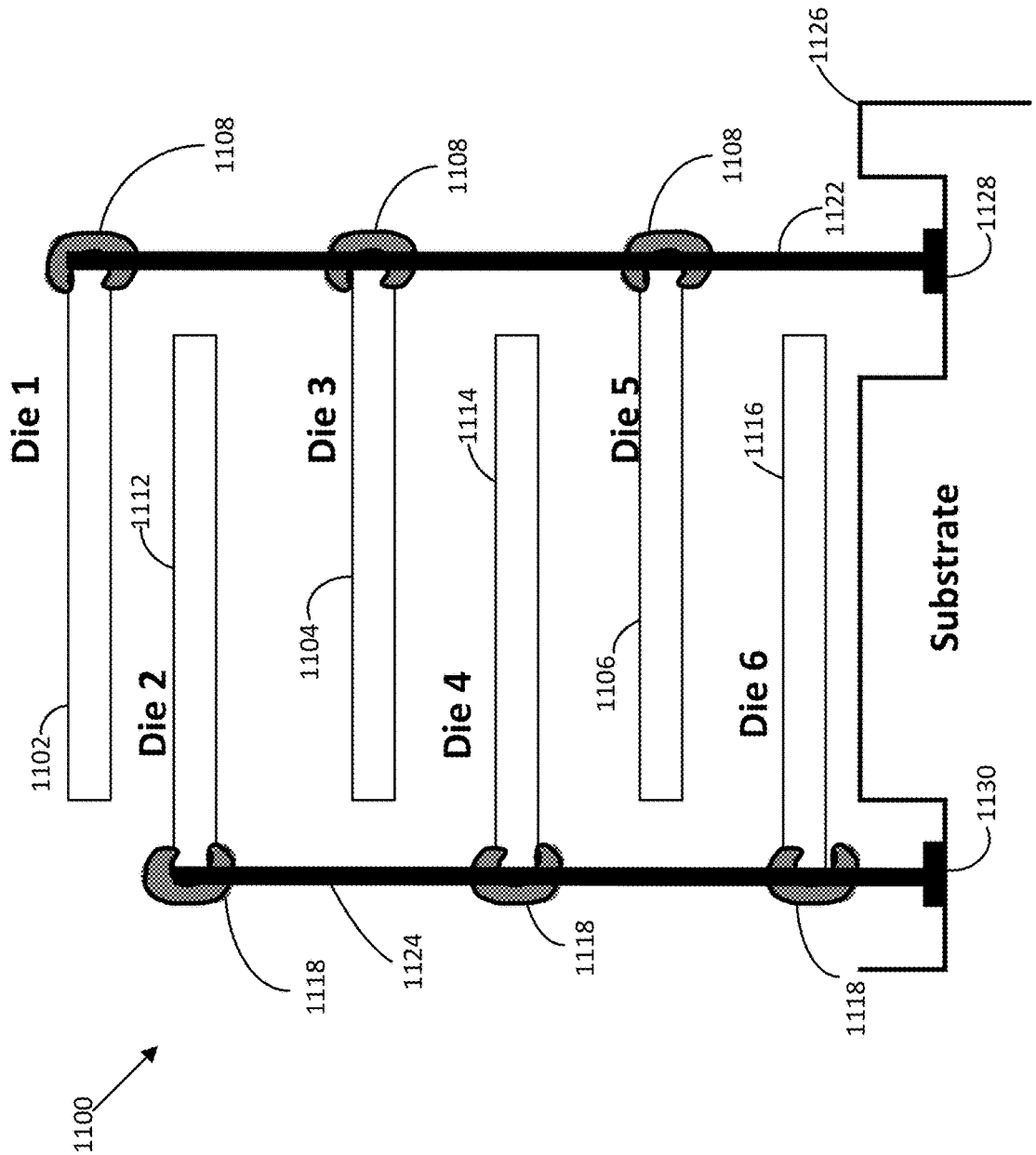
FIG. 11 is an alternate arrangement of silicon dice coupled to a substrate, in accordance with some embodiments of the disclosure.

Turning now to FIG. 11, an alternative arrangement of silicon dice is shown in assembly 1100. The assembly 1100 includes a first silicon die 1102, a third silicon die 1104, and a fifth silicon die 1106, which include connection pads 1108 on a first edge 1110 of the silicon dice 1102, 1104, and 1106. A second silicon die 1112, a fourth silicon die 1114, and a sixth silicon die 1116 are alternatingly positioned between the first silicon die 1102, the third silicon die 1104, and the fifth silicon die 1106, respectively. The second silicon die 1112, the fourth silicon die 1114, and the sixth silicon die 1116 include connection pads 1118 on a second edge 1120, opposite the first edge of the first silicon die 1102, the third silicon die 1104, and the fifth silicon die 1106. A first connecting wire 1122 is coupled to the connection pads 1108 of the first silicon die 1102, the third silicon die 1104 and the fifth silicon die 1106, and a second connecting wire 1124 is coupled to the connection pads 1118 of the second silicon die 1112, the fourth silicon die 1114, and the sixth silicon die 1116. The first connecting wire 1122 is coupled to a substrate 1126 at a first substrate connection pad 1128. Similarly, the second connecting wire 1124 is coupled to the substrate 1126 via a second connection pad 1130.

The assembly 1100 is referred to as a two-channel structure, allowing for every other die to be connected. This configuration can also allow for more space between connection due to the alternating of the silicon dice, reducing the risk of shorts caused by the soldering of the connecting wires to the die connection pads. The solder joints connecting the connecting wires to the connection pads may be done using the processes described above, such as process 300 and/or process 700, thereby allowing the connections to be made along the vertical sides of the respective silicon dice.

In some examples, a four-channel structure may be used, thereby allowing each fourth die to be connected on a given edge of the silicon dice. The example shown in FIG. 11 is for illustrative purposes, and it is contemplated that multiple dice may be connected using a two or four channel design as described above, as required for a given application.

The embodiments described are particularly useful for electrically connecting stacked silicon dies. For example, some versions of electronic memory devices include a plurality of stacked NAND dies. Thus, a memory device having a plurality of NAND dies stacked on a substrate would benefit from the features and die electrical interconnection methods disclosed herein.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments and should in no way be construed so as to limit the claims.

As used herein, the term substantially means about, almost, or within plus or minus 10-20% of the term being modified. For example, "substantially linear" means that an object is within 10-20% of being completely linear (i.e. straight). Similarly, "substantially round" means that an object may have 10-20% of distortion or deflection from a perfectly round dimension.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed devices, methods, and apparatuses will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An apparatus comprising:
   a substrate;
   two or more silicon dice, wherein a first die is disposed on the substrate and a second die is stacked on the first die, and the dice comprising:
      an upper planar surface parallel to the substrate;
      a lower planar surface parallel to the upper planar surface and spaced at a first distance from the upper planar surface;
      at least a first edge portion disposed between, and perpendicular to, the upper planar surface and the lower planar surface; and
      at least a first set of connection pads disposed on the at least first edge portion and wherein the first set of connection pads are in vertical alignment with each other;
   a conductive element configured to be coupled to the first set of connection pads; and
   a plurality of solder blocks coupled to the conductive element and spaced at an interval associated with a distance between the connection pads of the first set of connection pads.

2. The apparatus of claim 1, wherein the solder blocks are configured to be heated such that the solder blocks reflow and create a soldered connection between the conductive element and the first set of connection pads.

3. The apparatus of claim 1, wherein the solder blocks comprise a first groove having a width measuring approximately the same as the first distance and configured to accept the edge of the silicon dice within the first groove.

4. The apparatus of claim 3, wherein the width of the first groove is 10% wider than the width of the first edge portion.

5. The apparatus of claim 4, wherein the width of the first edge portion is 25 microns.

6. The apparatus of claim 1, wherein the conductive element is electrically connected to the substrate.

7. The apparatus of claim 6, wherein the substrate includes a channel and the conductive element is electrically connected to the substrate within the channel.

8. The apparatus of claim 1, further comprising means for attaching the first die to the second die.

9. The apparatus of claim 1, further comprising a die attach film disposed between and physically connecting the first and second dice.

10. The apparatus of claim 1, further comprising means for spacing the first die from the second die.

11. The apparatus of claim 1, wherein the conductive element comprises a tin plated copper wire.

12. The apparatus of claim 1, wherein a first subset of the two or more silicon dice have the first set of connection pads on the first edge, and a second subset of the two or more of silicon dice have a second set of connection pads on a second edge, wherein the second edge is different than the first edge.

13. The apparatus of claim 12, wherein the two or more silicon dice are arranged such that each of the first subset of the two or more silicon dice are alternated with the second subset of the two or more silicon dice.

14. The apparatus of claim 1, wherein at least one of the conductive element and the connection pads are coated in a flux material.

15. The apparatus of claim 1, wherein the conductive solder is comprised of at least one selected from the group consisting of gold, indium, iridium, tin-plated copper, and palladium.

16. A method comprising:
   stacking a plurality of silicon dice such that one or more edges of the plurality of silicon dice are in vertical alignment, wherein the one or more edges include a plurality of connection pads;
   positioning a substantially linear conductor on a substantially perpendicular axis to the one or more edges, wherein the linear conductor is in contact with one or more of the plurality of connection pads;
   applying a conductive solder to the one or more connection pads and one or more portions of the linear conductor in contact with the one or more connection pads; and
   applying heat to reflow the solder, to cause the solder to physically and electrically couple the one or more portions of the linear conductor to the one or more connection pads in contact therewith.

17. The method of claim 16, further comprising coating the linear conductor with a layer of flux.

18. The method of claim 16, wherein the conductive solder is applied by applying heated liquid solder to the one or more connection pads and the one or more portions of the linear conductor in contact with the one or more connection pads.

19. A method comprising:
   stacking a plurality of silicon dice such that one or more edges of the plurality of silicon dice are in vertical alignment, wherein the one or more edges include a plurality of connection pads;
   positioning a connecting wire on a substantially perpendicular axis to the one or more edges, wherein the connecting wire comprises a plurality of solder blocks spaced at an interval associated with a distance between a first set of aligned connection pads on the plurality of silicon dice, and wherein the connecting wire is positioned such that the plurality of solder blocks are in contact with the first set of aligned connection pads;
   applying heat to reflow the solder blocks to cause the solder blocks to physically couple the connecting wire to the aligned connection pads.

20. The method of claim 19, wherein a flame jet heating process is used to reflow the solder blocks.

* * * * *